(12) United States Patent
Engelhardt et al.

(10) Patent No.: US 8,772,133 B2
(45) Date of Patent: Jul. 8, 2014

(54) UTILIZATION OF A METALLIZATION SCHEME AS AN ETCHING MASK

(75) Inventors: Manfred Engelhardt, Villach-Landskron (AT); Martin Zgaga, Rosegg (AT); Karl Adolf Mayer, Villach (AT); Gudrun Stranzl, Goedersdorf (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/492,976

(22) Filed: Jun. 11, 2012

(65) Prior Publication Data

US 2013/0328195 A1 Dec. 12, 2013

(51) Int. Cl.
*H01L 21/00* (2006.01)
(52) U.S. Cl.
USPC ........... 438/460; 438/461; 438/462; 438/463; 438/464; 438/465

(58) Field of Classification Search
USPC .................................. 438/460–465, 706–744
See application file for complete search history.

(56) References Cited

U.S. PATENT DOCUMENTS

| | | | |
|---|---|---|---|
| 2004/0198063 A1* | 10/2004 | Subramanian et al. | 438/712 |
| 2007/0238239 A1* | 10/2007 | Zhuang et al. | 438/216 |
| 2008/0113508 A1* | 5/2008 | Akolkar et al. | 438/687 |
| 2010/0081235 A1* | 4/2010 | Furumura | 438/113 |

* cited by examiner

*Primary Examiner* — Kyoung Lee
*Assistant Examiner* — Ratisha Mehta

(57) ABSTRACT

The various aspects comprise methods and devices for processing a wafer.

An aspect of this disclosure includes a wafer. The wafer comprises a plurality of die regions; a plurality of kerf regions between the plurality of die regions; and a metallization area on the plurality of die regions.

14 Claims, 7 Drawing Sheets

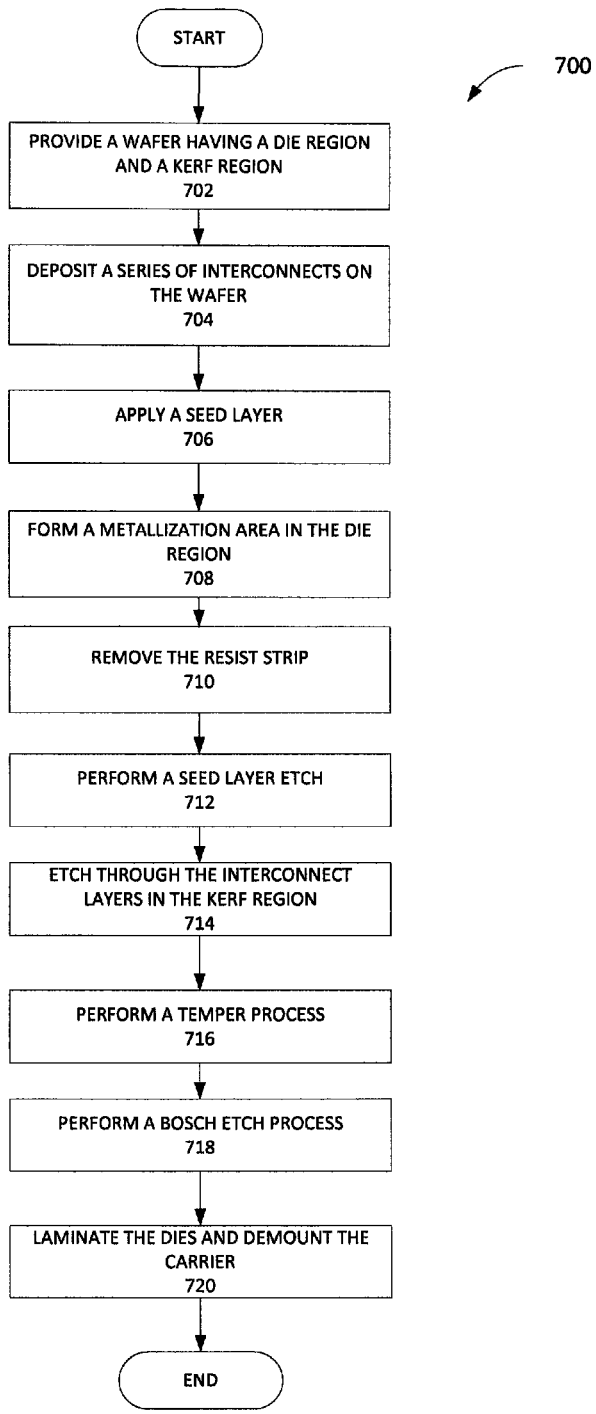

UTILIZATION OF A METALLIZATION SCHEME AS AN ETCHING MASK

TECHNICAL FIELD

Aspects of this disclosure relate generally to wafer dicing. In particular, an aspect of this disclosure relates to using a metallization scheme as an etching mask for plasma dicing.

BACKGROUND

Wafer dicing is a process by which die are separated from a wafer of semiconductor material following the processing of the wafer. The dicing process may be accomplished by scribing and breaking the wafer. This can be done by sawing or laser cutting.

Conventional mechanical sawing process needs a wide sawing street, which leads to less silicon area for active devices. Additionally, the mechanical sawing is confronted with damage due to chipping problems due to decreased wafer thickness and increase of back side metallization ratio. Quality and reliability issues are also a detractor.

Laser dicing needs a wider kerf and causes a ridge, which leads also to breakage in back end processing. Stealth dicing changes crystal structure to amorphous silicon, leads to unknown structures in the kerf. Also, in plasma dicing, no integration exists however for plasma diced dies in bulk and plasma diced dies without back side metallization.

During plasma dicing, etching may be performed. During an etch step, part of the wafer is protected from the etchant by a "masking" material which resists etching. In some cases, the masking material is a photoresist which has been patterned using photolithography. Other situations require a more durable mask, such as silicon nitride.

Therefore, it would be advantageous to have a method, system, and computer program product that addresses one or more of the issues discussed above.

SUMMARY

An aspect of this disclosure includes a method for processing a wafer. The method comprises providing a wafer having a plurality of die regions and a plurality of kerf regions; forming a metallization area in the plurality of die regions; and applying a gas composition to the wafer, the gas composition etching away the plurality of kerf regions.

An aspect of this disclosure includes a wafer. The wafer comprises a plurality of die regions; a plurality of kerf regions between the plurality of die regions; and a metallization area on the plurality of die regions.

An aspect of this disclosure provides a method of making a semiconductor device. The method comprises providing a semiconductor die with a plurality of die regions and a plurality of kerf regions; forming a metallization area in the plurality of die regions; and applying a gas composition to the wafer, the gas composition etching away the plurality of kerf regions.

BRIEF DESCRIPTION OF DRAWINGS

In the drawings, like reference characters generally refer to the same parts throughout the different views. The drawings are not necessarily to scale. In the following description, aspects of this disclosure are described with reference to the following drawings, in which:

FIG. 7 is a flowchart for dicing process in accordance with an aspect of this disclosure.

DETAILED DESCRIPTION

The following detailed description refers to the accompanying drawings that show, by way of illustration, specific details and aspects in which the invention may be practiced. The word "exemplary" is used herein to mean "serving as an example, instance, or illustration". Any aspect or design described herein as "exemplary" is not necessarily to be construed as preferred or advantageous over other aspects or designs.

Note that in this Specification, references to various features (e.g., elements, structures, modules, components, steps, operations, characteristics, etc.) included in "one aspect", "example aspect", "an aspect", "another aspect", "some aspect", "various aspects", "other aspects", "alternative aspect", and the like are intended to mean that any such features are included in one or more aspects of the present disclosure, but may or may not necessarily be combined in the same aspects.

Note that in this Specification, references to "a number of" may mean one or more. For example, a number of objects may be one object, ten objects, fifty objects, or any number of objects. Also note that in this Specification, references to "at least one of" may mean any combination. For example, at least one of object A and object B may be object A, object B, or both objects A and B.

Although the description is illustrated and described herein with reference to certain aspects, the description is not intended to be limited to the details shown. Modifications may be made in the details within the scope and range equivalents of the claims.

Wafers may commonly be used in the fabrication of integrated circuits (ICs) or chips. A wafer may include a plurality of die regions or integrally-formed dies. The die regions or dies may be separated by a singulation process such as sawing. Singulation of the dies may also be referred to as dicing.

Usually, dicing will be carried out along so-called dicing streets (sometimes also referred to as sawing streets or scribe lines) running between the dies and may result in the removal of the wafer material and destruction of any structures located in those dicing streets. The region of a wafer that will be affected (e.g. destroyed) by the dicing may also be referred to as a kerf region of the wafer.

Figure 1:
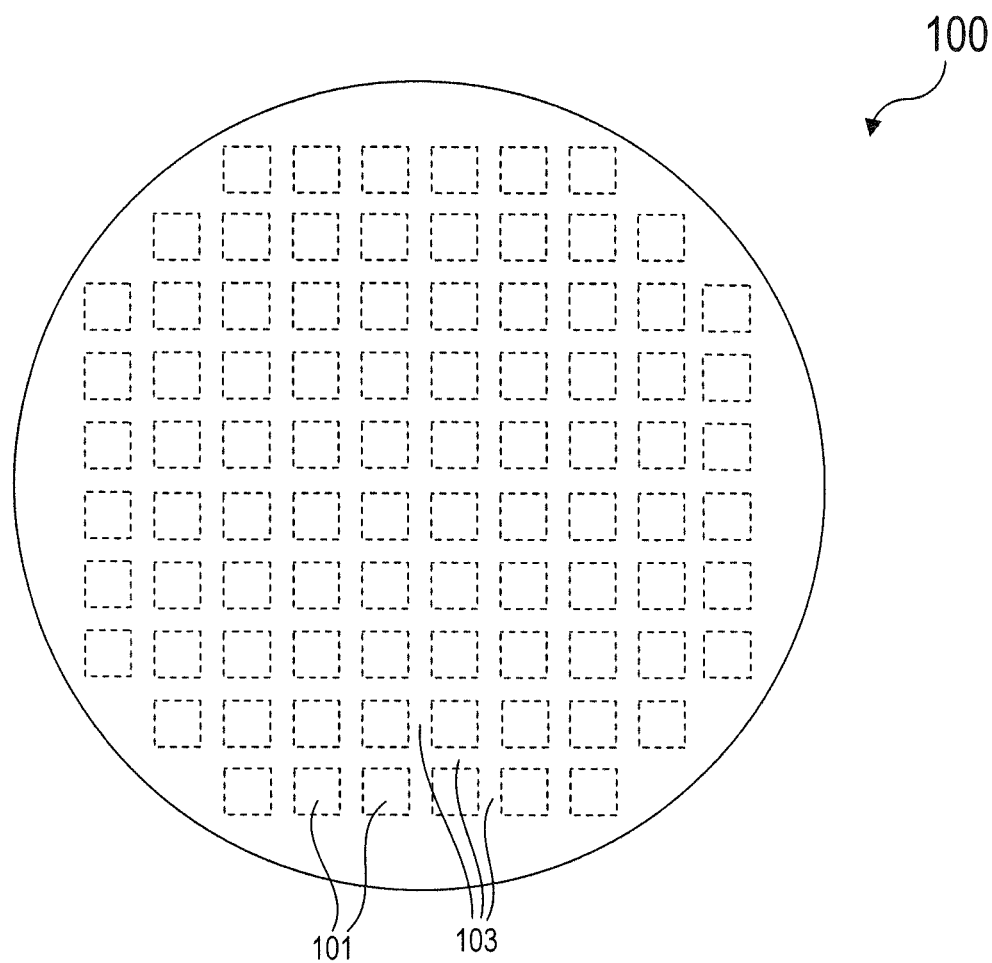
FIG. 1 shows a schematic plan view of a wafer in accordance with an aspect of this disclosure.

FIG. 1 shows a schematic plan view of a wafer in accordance with an aspect of this disclosure. Wafer 100 may include a plurality of die regions 101 separated by a kerf region 103 located between the die regions 101. The number of die regions 101 may be arbitrary. As shown in FIG. 1, the die regions 101 may have a quadratic shape, however the die regions 101 may also have a rectangular shape, or any other shape in general. As shown in FIG. 1, the die regions 101 may be arranged in a rectangular array, however the die regions 101 may also be arranged differently. As shown in FIG. 1, the wafer 100 may have a circular shape, however the wafer 100 may also have a rectangular or quadratic shape, or any other shape in general.

The term "kerf region" as used herein may be understood to refer to a region of a wafer that may be at least partially removed or destroyed in a die singulation or dicing process. For example, in accordance with various aspects, the kerf region 103 shown in FIG. 1 may illustratively include or correspond to one or more dicing streets or scribe lines of the wafer 100 (in other words, a line or lines along which the wafer 300 may be diced (e.g. cut, e.g. by means of sawing, laser cutting, or plasma etching)). In accordance with some aspects, the kerf region 103 may be located at least partially between the die regions 101 of the wafer 100. The number of die regions of the wafer 100 may be arbitrary in accordance with various aspects.

The die region 101 or the plurality of die regions of the wafer 100 may have any shape, for example a quadratic or rectangular shape in accordance with some aspects, however any other shape may be possible as well in accordance with some aspects.

In accordance with some aspects, the die regions may be arranged in a rectangular array, e.g. similar to the array shown in FIG. 1. However, in accordance with other aspects, the die regions may be arranged differently.

Figure 2:
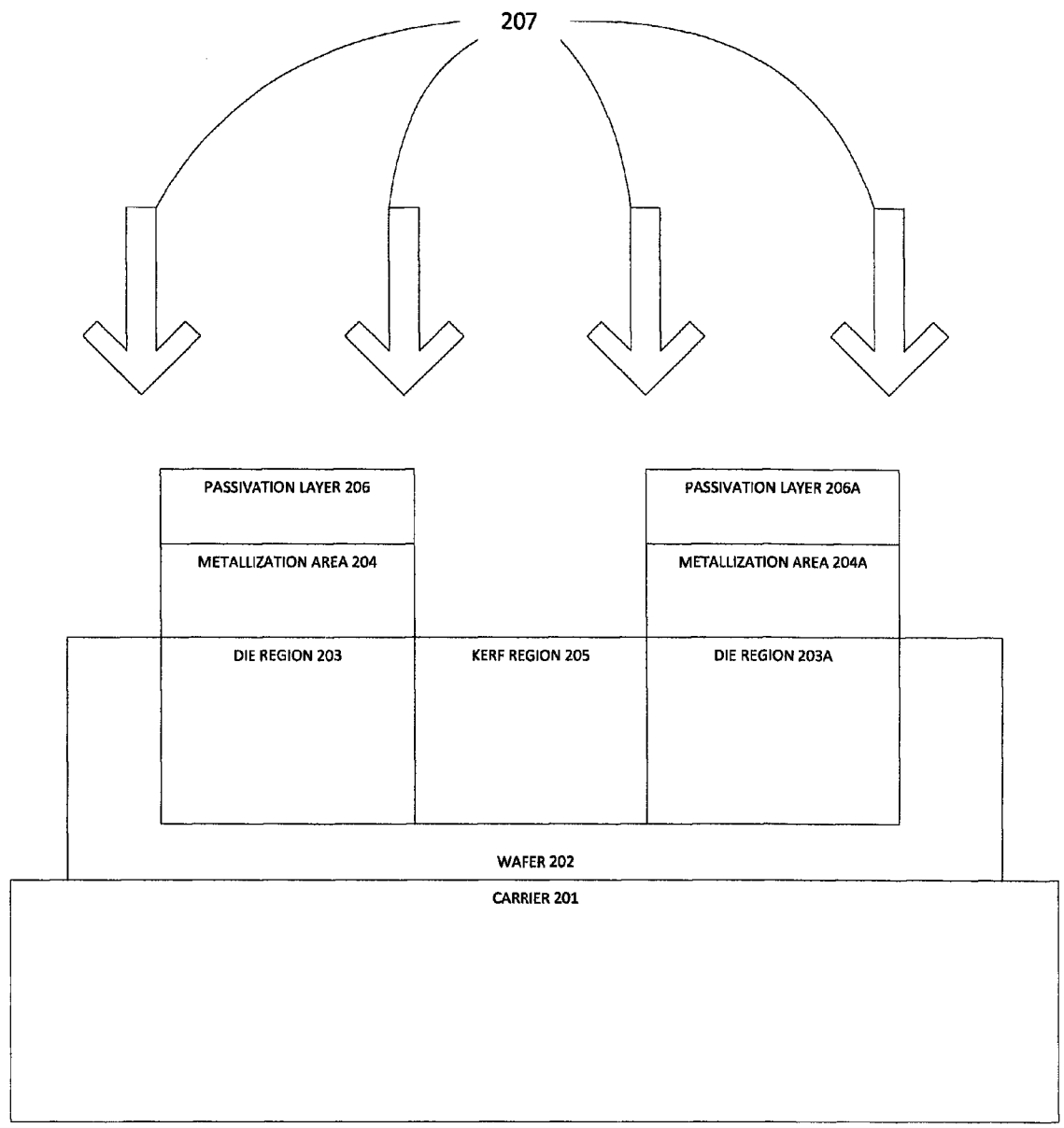
FIG. 2 shows a block diagram of a wafer attached to a carrier in accordance with an aspect of this disclosure.

FIG. 2 shows a block diagram of a wafer attached to a carrier in accordance with an aspect of this disclosure. Wafer 202 may be attached to carrier 201. Carrier 201 may be used for stability by wafer 202 during the dicing process. The wafer 202 may, for example, be a semiconductor wafer such as, for example, a silicon wafer (alternatively or in addition, any other suitable semiconductor material or materials, including compound semiconductor materials, may be used as well) in accordance with some aspects In accordance with various aspects, the wafer 202 may include a die region 203. In accordance with various aspects, the die region 203 may correspond to the area of a die, which may be obtained from the wafer 202 by a die singulation or dicing process.

In accordance with some aspects, the wafer 202 may include at least one additional die region 203a, as shown. In accordance with some aspects, the at least one additional die region 203a may correspond to the area of at least one additional die that may be obtained from the wafer 202 by the die singulation or dicing process. In accordance with some aspects, the at least one additional die region 203a may be configured in the same or a similar manner as the die region 203.

Clearly, in accordance with some aspects, the wafer 202 may include a plurality of die regions (e.g. die regions 203, 203a and possibly additional die regions (not shown)) or integrally-formed dies. Thus, the wafer 202 may, for example, have a similar structure as the wafer 100 shown in FIG. 1 (for example, die regions 202, 203a may correspond to two neighboring die regions 101 of wafer 100 in FIG. 1), and the wafer 202 may later be diced (e.g. by sawing) to obtain single dies.

In accordance with various aspects, the die region 203 may have a metallization area 204, as shown. In other words, a metallization area 204 may be located in the die region 203. In accordance with some aspects, the metallization area 204 may, for example, be located in a peripheral region of the die region 203, for example proximate an edge of the die region 203. In accordance with some aspects, the metallization area 204 may include or may be a pad. In accordance with some aspects, the pad may contain or may be made of a metal or a metal alloy such as, for example, copper (Cu), aluminum (Al), or an alloy containing Cu and/or Al. Alternatively or in addition, the pad may contain or may be made of other metals or metal alloys.

In accordance with some aspects, the metallization area 204 may be disposed on or above an upper surface of the wafer 202 in the die region 203.

In accordance with some aspects, the die region 203a may have at least one additional metallization area 204a (a first additional metallization area 204a is shown as an example; however there may be only one additional metallization area or more than two additional metallization areas present in accordance with some aspects). The additional metallization area(s) may be configured in the same or a similar manner as the metallization area 204, for example as pads.

In accordance with various aspects, the wafer 202 may include a kerf region 205. The kerf region 205 may be located adjacent the die region 203.

The term "kerf region" as used herein may be understood to refer to a region of a wafer that may be at least partially removed or destroyed in a die singulation or dicing process. For example, in accordance with various aspects, the kerf region 205 may illustratively include or correspond to one or more dicing streets or scribe lines of the wafer 202 (in other words, a line or lines along which the wafer 300 may be diced (e.g. cut, e.g. by means of sawing)). In accordance with some aspects, the kerf region 205 may be located at least partially between the die region 203 and at least one additional die region (e.g. the additional die region 203a, and possibly other additional die regions (not shown)) of the wafer 202. For example, in accordance with some aspects, the wafer 202 may include a plurality of die regions 203, 203a that may be separated by the kerf region 205 that may be formed between the die regions 203, 203a, e.g. similar to the wafer 100 shown in FIG. 1. The number of die regions of the wafer 202 may be arbitrary in accordance with various aspects.

The die region 203 or the plurality of die regions of the wafer 202 may have any shape, for example a quadratic or rectangular shape in accordance with some aspects, however any other shape may be possible as well in accordance with some aspects.

In accordance with some aspects, the die regions may be arranged in a rectangular array, e.g. similar to the array shown in FIG. 1. However, in accordance with other aspects, the die regions may be arranged differently.

In accordance with some aspects, the passivation layer 206 may be disposed on or above an upper surface of the metallization area 204.

In accordance with some aspects, the metallization area 204a may have at least one additional passivation layer 206a (a first additional passivation layer 206a is shown as an example; however there may be only one additional passivation layer or more than two additional passivation layers present in accordance with some aspects). The additional passivation layer(s) may be configured in the same or a similar manner as the passivation layer 206.

In accordance with some aspects of this disclosure, the passivation layer 206 may be a material which is "passive" and is a shielding outer layer of corrosion which can be established with a micro-coating. Passivation is useful in strengthening, and preserving the appearance of, metallic.

In accordance with some aspects of this disclosure, passivation layer 206 may be the same metal or metal alloy as metallization area 204. Passivation layer 206 may contain or may be made of a metal or a metal alloy such as, for example, copper (Cu), aluminum (Al), or an alloy containing Cu and/or Al. Alternatively or in addition, passivation layer 206 may contain or may be made of other metals or metal alloys.

In accordance with some aspects, passivation layer 206 may be the same metal or metal alloy as metallization area 204 until passivation layer 206 comes into contact with gas composition 207. Metallization area 204 may react with gas composition 207 to create passivation layer 206.

Gas composition 207 may be of fluorine or a fluorine compound. In other aspects of this disclosure, gas composition 207 is other combinations of gas.

Figure 3:
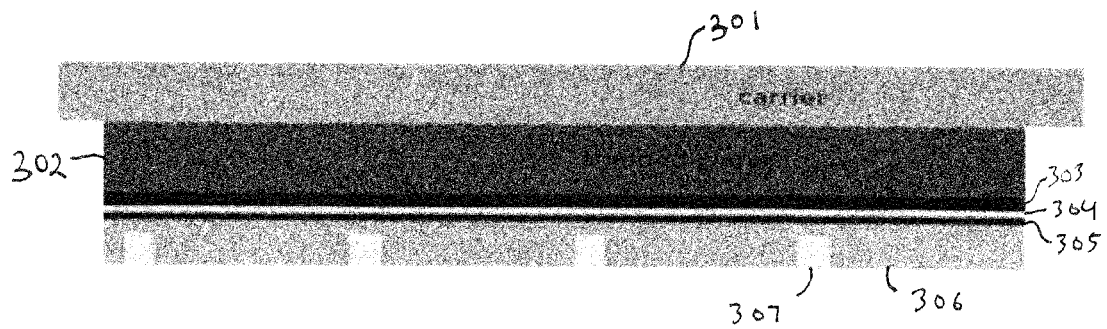
FIG. 3 shows an illustration of a side view of a wafer attached to a carrier with a photo resist in accordance with an aspect of this disclosure.

FIG. 3 shows an illustration of a side view of a wafer attached to a carrier with a photo resist in accordance with an aspect of this disclosure. Wafer 302 may be attached to carrier 301. Carrier 301 may be used for stability by wafer 302 during the dicing process. The wafer 302 may, for example, be a semiconductor wafer such as, for example, a silicon wafer (alternatively or in addition, any other suitable semiconductor material or materials, including compound semiconductor materials, may be used as well) in accordance with some aspects.

In accordance with various aspects, layers 303-305 are disposed on wafer 302. Layers 303-305 may be TiW/W/TiW layers, respectively. In different aspects of this disclosure, other metal combinations may be used for layers 303-305. In an aspect, layers 303-305 may be 300 nm/300 nm/50 nm in width, respectively. In different aspects of this disclosure, layers 303-305 may be other widths.

In accordance with various aspects, metallization area 306 is disposed on layer 305. In accordance with some aspects, the pad may contain or may be made of a metal or a metal alloy such as, for example, copper (Cu), aluminum (Al), or an alloy containing Cu and/or Al. Alternatively or in addition, metallization area 306 may be made of other metals or metal alloys.

In accordance with various aspects, photo resist layer 307 may be disposed between areas of metallization area 306. Photo resist layer 307 may be used in a photolithography process. In an aspect of this disclosure, photo resist layer 307 may be around 15 micrometers width of a negative photoresist resin. In different aspects of this disclosure, a positive photoresist resin may be used.

In accordance with various aspects, photo resist layer 307 may be used during an electrochemical deposition process to create a pattern for metallization area 306. In different aspects of this disclosure, metallization layer 306 may be sputtered onto layer 305.

Figure 4:
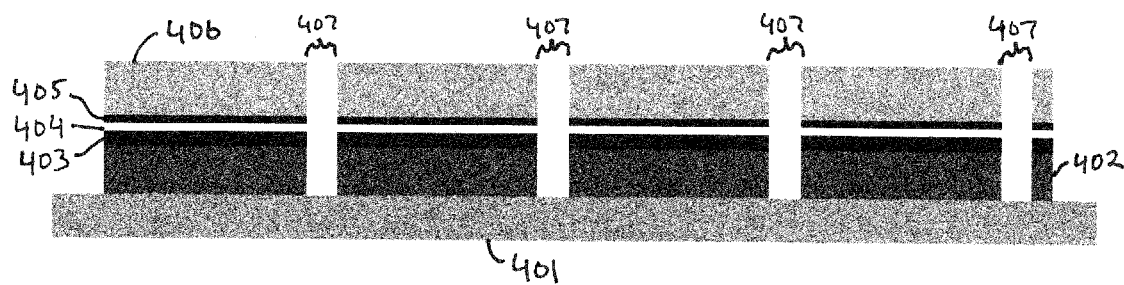
FIG. 4 shows an illustration of a side view of a wafer attached to a carrier after etching of the wafer in accordance with an aspect of this disclosure.

FIG. 4 shows an illustration of a side view of a wafer attached to a carrier after etching of the wafer in accordance with an aspect of this disclosure. Wafer 402 may be attached to carrier 401. Carrier 401 may be used for stability by wafer 402 during the dicing process. The wafer 402 may, for example, be a semiconductor wafer such as, for example, a silicon wafer (alternatively or in addition, any other suitable semiconductor material or materials, including compound semiconductor materials, may be used as well) in accordance with some aspects.

In accordance with various aspects, layers 403-405 are disposed on wafer 402. Layers 403-405 may be TiW/W/TiW layers, respectively. In different aspects of this disclosure, other metal combinations may be used for layers 403-405. In an aspect, layers 403-405 may be 300 nm/300 nm/50 nm in width, respectively. In different aspects of this disclosure, layers 403-405 may be other widths.

In accordance with various aspects, metallization area 406 is disposed on layer 405. In accordance with some aspects, metallization area 406 may contain or may be made of a metal or a metal alloy such as, for example, copper (Cu), aluminum (Al), or an alloy containing Cu and/or Al. Alternatively or in addition, metallization area 406 may be made of other metals or metal alloys.

In accordance with an aspect of this disclosure, wafer 402 has been etched during a dicing process. For example, wafer 402 may have been diced in areas 407 by a BOSCH etching process. The BOSCH process is a type of deep reactive-ion etching (DRIE) process. DRIE is a highly anisotropic etch process used to create deep penetration, steep-sided holes and trenches in wafers/substrates, typically with high aspect ratios. The BOSCH process is also known as pulsed or time-multiplexed etching.

During the BOSCH process, the system alternates repeatedly between two modes to achieve nearly vertical structures. The first mode is standard, nearly isotropic plasma etch. The plasma contains some ions, which attack the wafer from a nearly vertical direction. Sulfur hexafluoride may be used for a silicon wafer. In different aspects, sulfur hexafluoride may be gas composition 207 as shown in FIG. 2. In various aspects, different gas compositions may be used that are suitable for creating a passivation layer with metallization area 406.

The second mode is deposition of a chemically inert passivation layer. The passivation layer protects the entire substrate from further chemical attack and prevents further etching. However, during the etching phase, the directional ions that bombard the substrate attack the passivation layer at the bottom of the trench (but not along the sides) in areas 407. The directional ions collide with the bottom of the trench and sputter it off, exposing the substrate to the chemical etchant. These etch/deposit steps are repeated many times over resulting in a large number of very small isotropic etch steps taking place only at the bottom of the etched pits.

However, in aspects of this disclosure, due to the metallization area 406 reacting with the gas composition, the second mode of depositing the passivation layer is not necessary. The second mode may not be necessary because passivation layer is formed from the metallization area 406 reacting with the gas composition.

Figure 5:
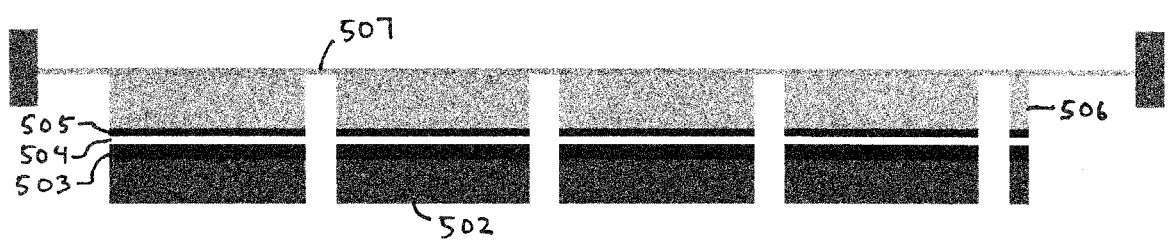
FIG. 5 shows an illustration of a side view of a wafer attached to a laminate in accordance with an aspect of this disclosure.

FIG. 5 shows an illustration of a side view of a wafer attached to a laminate in accordance with an aspect of this disclosure. The wafer 502 may, for example, be a semiconductor wafer such as, for example, a silicon wafer (alternatively or in addition, any other suitable semiconductor material or materials, including compound semiconductor materials, may be used as well) in accordance with some aspects.

In accordance with various aspects, layers 503-505 are disposed on wafer 502. Layers 503-505 may be TiW/W/TiW layers, respectively. In different aspects of this disclosure, other metal combinations may be used for layers 503-505. In an aspect, layers 503-505 may be 300 nm/300 nm/50 nm in width, respectively. In different aspects of this disclosure, layers 503-505 may be other widths.

In accordance with various aspects, metallization area 506 is disposed on layer 505. In accordance with some aspects, the pad may contain or may be made of a metal or a metal alloy such as, for example, copper (Cu), aluminum (Al), or an alloy containing Cu and/or Al. Alternatively or in addition, metallization area 506 may be made of other metals or metal alloys.

In accordance with various aspects, the carrier from FIGS. 3 and 4 has been demounted. Additionally, laminate 507 has been applied to metallization areas 506.

Figure 6:
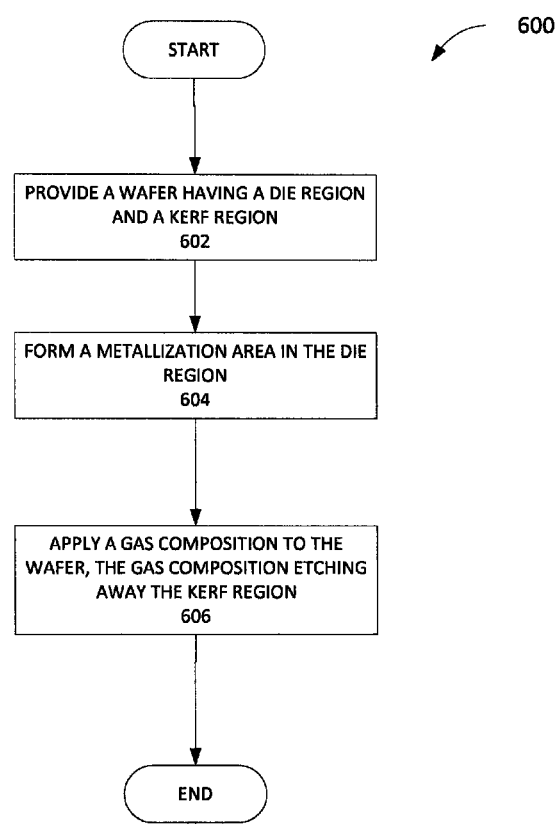
FIG. 6 is a flowchart for processing a wafer in accordance with an aspect of this disclosure.

FIG. 6 is a flowchart for processing a wafer in accordance with an aspect of this disclosure. Process 600 may be used with a wafer ready for dicing, such as wafer 100 as shown in FIG. 1.

In an aspect, the process begins with providing a wafer having a die region and a kerf region (step 602).

Then, the process forms a metallization area in the die region (step 804). The metallization layer may contain or may be made of a metal or a metal alloy such as, for example, copper (Cu), aluminum (Al), or an alloy containing Cu and/or Al. Alternatively or in addition, the metallization area may be made of other metals or metal alloys.

Next, the process applies a gas composition to the wafer, the gas composition etching away the kerf (step 806). In accordance with some aspects, the gas composition reacts with the metallization area to form a passivation layer. Also, the gas composition may not etch away the passivation layer. However, the gas composition may etch away the passivation layer at the bottom of the kerf regions. In accordance with some aspects, the gas composition may be fluorine, a combination of fluorine with other gases such as oxygen, fluoride, or any other compound that is suitable.

In accordance with some aspects, when the process applies the gas composition, the process performs a BOSCH etch process.

Additionally, after step 806, the process may further identify if the wafer has been separated into separate dies (the etch process is complete), laminate the wafer, and remove the carrier from the separated dies.

Thereafter, this process terminates.

FIG. 7 is a flowchart for dicing process in accordance with an aspect of this disclosure. Process 700 may be used with a wafer ready for dicing, such as wafer 100 as shown in FIG. 1.

In an aspect, the process begins with providing a wafer having a die region and a kerf region (step 702).

Next, the process deposits a series of interconnects on the wafer (step 704). For example, during the formation of interconnects, the process may deposit layers of TiW (Titanium Tungsten), W (Tungsten), then another TiW layer on the wafer. In different aspects of this disclosure, other types of materials may be used to form interconnects. This is only one example of one aspect of interconnect materials and process.

Then, the process applies a seed layer (step 706). The seed layer may be the same material as the metallization area. In different embodiments, the seed layer may contain or may be made of a metal or a metal alloy such as, for example, copper (Cu), aluminum (Al), or an alloy containing Cu and/or Al.

Then, the process forms a metallization area in the die region (step 708). The metallization area may contain or may be made of a metal or a metal alloy such as, for example, copper (Cu), aluminum (Al), or an alloy containing Cu and/or Al. Alternatively or in addition, the metallization area may be made of other metals or metal alloys. The metallization area may be deposited by electro-chemical deposition (ECD). In the alternative or in addition, metallization area may be sputtered onto the wafer. The process may use an ECD CM resist coating of around 15 micrometers of THB negative resist. In different aspects of this disclosure, other types of negative resists may be used, or even positive resists may be used for ECD.

Next, the process may remove the resist strip (step 710). The, the process may perform a seed layer etch (step 712). Next, the process may etch through the interconnect layers in the kerf region (step 714). The process may use a reactive ion etching process to etch through the interconnect layers. In different aspects of this disclosure, the process may use other types of etching processes. Then, the process may perform a temper process (step 716).

Next, the process performs a BOSCH etch process (step 718). In an aspect of the disclosure, the BOSCH etch process may be a modified BOSCH etch process with only a single mode. For example, during this process, only a gas composition which reacts with the metallization area to create a passivation layer may be applied. The gas composition may be a combination of oxygen and a fluoride compound. In some other aspects, other gas compositions may be used that may include other gasses mixed with a compound made from fluorine.

In one or more aspects, instead of a BOSCH etch process, the process may perform an electrochemical etch. In one or more aspects, the electrochemical etch may be used with hydrofluoric acid and not just gas. The process may provide porous silicon formation and other photo electrochemical effects at silicon electrodes anodized in hydrofluoric acid.

Then, the process laminates the dies and demounts the carrier (step 720). During lamination, a laminate is placed on the opposite side of the dies from the carrier. The laminate will hold the dies in place while the carrier is demounted.

Thereafter, this process terminates.

The flowcharts and block diagrams in the different depicted aspects illustrate the architecture, functionality, and operation of some possible implementations of apparatus, methods, system, and computer program products. In this regard, each block in the flowchart or block diagrams may represent a module, segment, or portion of computer usable or readable program code, which comprises one or more executable instructions for implementing the specified function or functions. In some alternative implementations, the function or functions noted in the block may occur out of the order noted in the figures. For example, in some cases, two blocks shown in succession may be executed substantially concurrently, or the blocks may sometimes be executed in the reverse order, depending upon the functionality involved.

An aspect of this disclosure provides a method of processing a wafer. The method comprising: providing a wafer having a plurality of die regions and a plurality of kerf regions; forming a metallization area in the plurality of die regions; and applying a gas composition to the wafer, the gas composition etching away the plurality of kerf regions.

In an aspect of this disclosure, the gas composition reacts with the metallization area to form a passivation layer.

In an aspect of this disclosure, the metallization area is a self-aligning mask for die separation.

In an aspect of this disclosure, the gas composition does not etch away the passivation layer.

In an aspect of this disclosure, the metallization layer is copper.

In an aspect of this disclosure, the gas composition comprises fluorine.

In an aspect of this disclosure, applying the gas composition comprises performing a BOSCH etch process.

In an aspect of this disclosure, applying the gas composition comprises performing an electrochemical etch.

In an aspect of this disclosure, the method further comprises forming interconnects on the wafer before forming the metallization area.

In an aspect of this disclosure, the method further comprises forming a seed layer onto the interconnects.

In an aspect of this disclosure, the method further comprises: identifying that the wafer has been separated into separate dies; laminating the wafer; and removing the carrier from the separate dies.

An aspect of this disclosure provides a wafer comprising: a plurality of die regions; a plurality of kerf regions between the plurality of die regions; and a metallization area on the plurality of die regions.

In an aspect of this disclosure, the metallization area is configured to react with a gas composition to form a passivation layer.

In an aspect of this disclosure, the metallization area is a self-aligning mask for die separation.

In an aspect of this disclosure, the passivation layer does not etch away when exposed to the gas composition.

In an aspect of this disclosure, the metallization layer is copper.

In an aspect of this disclosure, the gas composition comprises fluorine.

An aspect of this disclosure provides a method of making a semiconductor device. The method comprises providing a semiconductor die with a plurality of die regions and a plurality of kerf regions; forming a metallization area in the plurality of die regions; and applying a gas composition to the wafer, the gas composition etching away the plurality of kerf regions.

In an aspect of this disclosure, the gas composition reacts with the metallization area to form a passivation layer.

In an aspect of this disclosure, the metallization area is a self-aligning mask for die separation.

The invention claimed is:

1. A method of processing a wafer, the method comprising:
providing a wafer having a plurality of die regions and a plurality of kerf regions;
forming a metallization area in the plurality of die regions, the metallization layer having at least an exposed top surface; and
applying a gas composition to the wafer, the gas composition etching away the plurality of kerf regions,
wherein the metallization area is a self-aligning mask for die separation, and
wherein the gas composition reacts at least with the at least exposed to surface of the metallization area to form a passivation layer.

2. The method of claim 1, wherein the gas composition does not etch away the passivation layer.

3. The method of claim 1, wherein the metallization layer is copper.

4. The method of claim 1, wherein the gas composition comprises fluorine.

5. The method of claim 1, wherein applying the gas composition comprises:
performing a BOSCH etch process.

6. The method of claim 1, wherein applying the gas composition comprises:
performing an electrochemical etch.

7. The method of claim 1, further comprising:
forming interconnects on the wafer before forming the metallization area.

8. The method of claim 7, further comprising:
forming a seed layer onto the interconnects.

9. The method of claim 1, further comprising:
identifying that the wafer has been separated into separate dies;
laminating the wafer; and
removing a carrier from the separate dies.

10. A wafer comprising:
a plurality of die regions;
a plurality of kerf regions between the plurality of die regions; and
a metallization area on the plurality of die regions, the metallization layer having at least an exposed top surface;
wherein the metallization area is a self-aligning mask for die separation, and
wherein at least the at least exposed top surface of the metallization area is configured to react with a gas composition to form a passivation layer.

11. The wafer of claim 10, wherein the passivation layer does not etch away when exposed to the gas composition.

12. The wafer of claim 1, wherein the metallization layer is copper.

13. The wafer of claim 1, wherein the gas composition comprises fluorine.

14. A method of making a semiconductor device, comprising:
providing a semiconductor die with a plurality of die regions and a plurality of kerf regions;
forming a metallization area in the plurality of die regions, the metallization layer having at least an exposed top surface; and
applying a gas composition to the wafer, the gas composition etching away the plurality of kerf regions,
wherein the metallization area is a self-aligning mask for die separation, and
wherein the gas composition reacts at least with the at least exposed top surface of the metallization area to form a passivation layer.

* * * * *

UNITED STATES PATENT AND TRADEMARK OFFICE
CERTIFICATE OF CORRECTION

PATENT NO. : 8,772,133 B2
APPLICATION NO. : 13/492976
DATED : July 8, 2014
INVENTOR(S) : Manfred Engelhardt et al.

Page 1 of 1

It is certified that error appears in the above-identified patent and that said Letters Patent is hereby corrected as shown below:

In the Claims

In column 9, line 36, claim 1, please replace "exposed to surface" by "exposed top surface"

Signed and Sealed this
Third Day of February, 2015

Michelle K. Lee
*Deputy Director of the United States Patent and Trademark Office*